United States Patent
Shih et al.

(10) Patent No.: US 9,466,605 B2
(45) Date of Patent: Oct. 11, 2016

(54) MANUFACTURING METHOD OF NON-VOLATILE MEMORY

(71) Applicant: Powerchip Technology Corporation, Hsinchu (TW)

(72) Inventors: Kai-Yao Shih, Hsinchu (TW); Ssu-Ting Wang, Taichung (TW); Chi-Kai Feng, Hsinchu (TW); Tzung-Hua Ying, Hsinchu (TW); Te-Yuan Yin, Hsinchu (TW)

(73) Assignee: Powerchip Technology Corporation, Hsinchu (TW)

(*) Notice: Subject to any disclaimer, the term of this patent is extended or adjusted under 35 U.S.C. 154(b) by 0 days.

(21) Appl. No.: 14/601,232

(22) Filed: Jan. 21, 2015

(65) Prior Publication Data
US 2016/0172367 A1  Jun. 16, 2016

(30) Foreign Application Priority Data
Dec. 15, 2014 (TW) .............................. 103143659 A (51) Int. Cl.
| | | |
|---|---|---|
| H01L 21/311 | (2006.01) | |
| H01L 21/266 | (2006.01) | |
| H01L 27/115 | (2006.01) | |
| H01L 21/265 | (2006.01) | |
| H01L 29/40 | (2006.01) | |
| H01L 29/66 | (2006.01) | |

(52) U.S. Cl.
CPC ....... H01L 27/11548 (2013.01); H01L 21/265 (2013.01); H01L 21/266 (2013.01); H01L 21/31111 (2013.01); H01L 27/11524 (2013.01); H01L 27/11529 (2013.01); H01L 29/401 (2013.01); H01L 29/6656 (2013.01); H01L 29/66825 (2013.01)

(58) Field of Classification Search
CPC ........... H01L 27/11548; H01L 21/265; H01L 21/266; H01L 21/31111; H01L 27/11524; H01L 27/11529; H01L 29/401; H01L 29/6656; H01L 29/66825
See application file for complete search history.

(56) References Cited

U.S. PATENT DOCUMENTS

| | | | | |
|---|---|---|---|---|
| 7,138,323 | B2* | 11/2006 | Kavalieros | ........ H01L 21/28079 257/E21.202 |
| 7,687,347 | B2* | 3/2010 | Shum | .................... H01L 27/115 257/E21.598 |
| 8,031,532 | B2 | 10/2011 | Shum et al. | |
| 8,455,923 | B2 | 6/2013 | Lee et al. | |
| 2005/0045941 | A1* | 3/2005 | Kurita | .................. H01L 27/115 257/315 |

FOREIGN PATENT DOCUMENTS

| | | |
|---|---|---|
| TW | 200605332 | 2/2006 |
| TW | 200913167 | 3/2009 |
| TW | 201347148 | 11/2013 |

OTHER PUBLICATIONS

"Office Action of Taiwan Counterpart Application", issued on Jun. 2, 2016, p. 1-p. 6, in which the listed references were cited.

\* cited by examiner

*Primary Examiner* — Allen Parker
*Assistant Examiner* — Gustavo Ramallo
(74) *Attorney, Agent, or Firm* — Jianq Chyun IP Office (57) ABSTRACT

A method of manufacturing a non-volatile memory is provided. A substrate including a first region and a second region is provided. A first patterning process is performed to the first region, so as to form a plurality of gate stack structures in the first region. Afterwards, a first sidewall oxide layer is formed to cover sidewalls and an upper surface of each gate stack structure, and a protection layer is then formed on the first sidewall oxide layer. Next, an ion implantation process is performed to the second region, and a second patterning process is performed to the second region so as to form a plurality of gate structures. Then, a second sidewall oxide layer covering sidewalls of each gate structure is formed.

13 Claims, 6 Drawing Sheets

MANUFACTURING METHOD OF NON-VOLATILE MEMORY

CROSS-REFERENCE TO RELATED APPLICATION

This application claims the priority benefit of Taiwan application serial no. 103143659, filed on Dec. 15, 2014. The entirety of the above-mentioned patent application is hereby incorporated by reference herein and made a part of this specification.

BACKGROUND OF THE INVENTION

1. Field of the Invention

The present invention generally relates to a manufacturing method of a memory, in particular, to a manufacturing method of a non-volatile memory.

2. Description of Related Art

As the non-volatile memory can keep the stored data even after the power is off, many electrical products must have such memory to maintain the normal booting operation of electrical products. Great attention has been drawn to the flash memory, owing to its characteristics in repeated operation of the data being stored, read or erased for many times. Therefore, the flash memory has been widely used in personal computers and electronic equipment. It is desirable to reduce the thermal budget for the manufacturing processes of the flash memory and increase the reliability of memory cells, so as to further enhance the device performance and lower the production cost.

SUMMARY OF THE INVENTION

The present invention provides a manufacturing method of a non-volatile memory. By using such manufacturing method, it is possible to provide sidewall oxide layer(s) of good quality to enhance the reliability of the memory cell and to avoid the thermal shocks to the peripheral circuit region with lower thermal budget.

The present invention provides a method for manufacturing a non-volatile memory. A substrate comprising a first region and a second region is provided and a first patterning process is performed to the first region to form a plurality of gate stack structures in the first region. Later, a first sidewall oxide layer is formed to cover sidewalls and an upper surface of each of the plurality of gate stack structure and a protective layer is formed on the first sidewall oxide layer. Then, after performing an ion implantation process to the second region, a second patterning process is performed to the second region to form a plurality of gate structures in the second region. Later, a second sidewall oxide layer is formed to cover sidewalls of each of the plurality of gate structures.

According to one embodiment of the present invention, the first region is a memory cell region, and the second region is a peripheral circuit region. According to one embodiment of the present invention, each of the plurality of gate stack structures includes a tunnel dielectric layer, a floating gate, an inter-gate dielectric layer and at least a control gate in the first region, while each of the plurality of gate structures comprises a patterned gate oxide layer and a gate in the second region.

According to one embodiment of the present invention, the manufacturing method further comprises forming a first high-temperature deposition layer between the first sidewall oxide layer and the protective layer.

According to one embodiment of the present invention, after performing the ion implantation process to the second region, a gate material layer is formed in the second region. Then, the protective layer in the first region is removed to expose the underlying first temperature deposition layer. Later, the first high-temperature deposition layer is etched to form first spacers on the sidewalls of the plurality of gate stack structures covered with the first sidewall oxide layer and to expose a part of the first sidewall oxide layer on the upper surfaces of the plurality of gate stack structures. Afterwards, the second patterning process is performed to the second region to form the plurality of gate structures in the second region and to form the second sidewall oxide layer.

According to one embodiment of the present invention, the manufacturing method further comprises forming a second high-temperature deposition layer on the gate material layer after the gate material layer is formed in the second region.

According to one embodiment of the present invention, the manufacturing method further comprises removing the second high-temperature deposition layer before removing the protective layer in the first region.

According to one embodiment of the present invention, the manufacturing method further comprises forming a second spacer outside of the first spacer and forming a dielectric layer outside of the second sidewall oxide layer after the second sidewall oxide layer is formed.

According to one embodiment of the present invention, a material of the protective layer is silicon nitride or polysilicon.

According to one embodiment of the present invention, a material of the protective layer is silicon nitride or silicon oxynitride.

According to one embodiment of the present invention, the first sidewall oxide layer is formed at a temperature higher than a temperature at which the second sidewall oxide layer is formed.

According to one embodiment of the present invention, the method for forming the first sidewall oxide layer comprises an in-situ steam generation process or a wet oxidation process, while the method for forming the second sidewall oxide layer comprises a rapid thermal oxidation process.

For the manufacturing method of the non-volatile memory according to embodiments of the present invention, the first sidewall oxide layer is formed to cover the gate stack structure(s) in the memory cell region and a protective oxide layer is formed on the first sidewall oxide layer. Thereafter, the ion implantation process is performed to the peripheral circuit region, and the second sidewall oxide layer is formed to cover the gate structure(s) in the peripheral circuit region. Therefore, it is possible to effectively prevent thermal shocks in the peripheral circuit region and reduce the thermal budget. Also, the sidewall oxide layer(s) of good quality can be offered, which further enhances the reliability of memory cells.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIGS. 1A to 1F are schematic cross-sectional views showing the steps of the manufacturing process for a non-volatile memory according to one embodiment of the present invention.

Figure 1A:
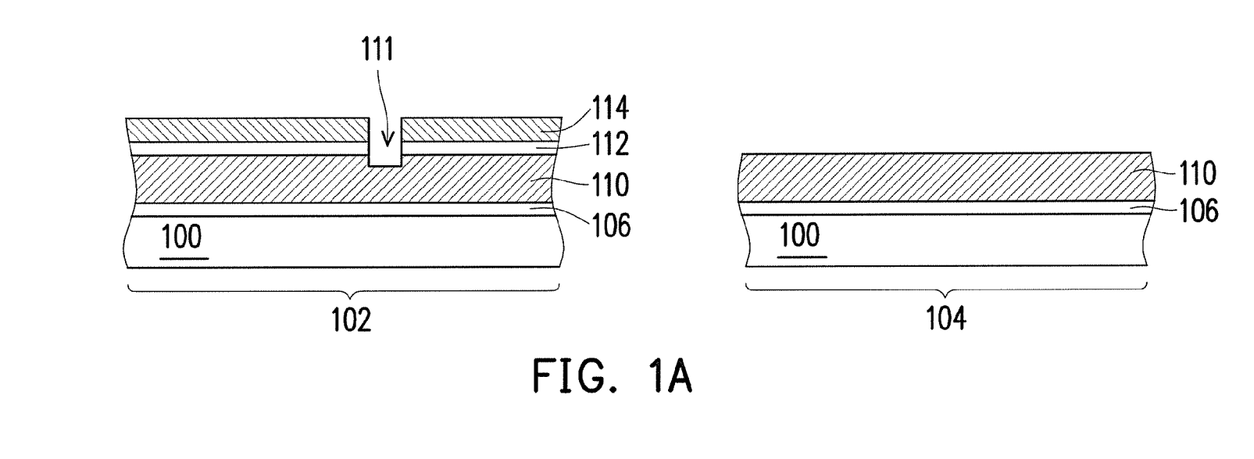
FIG. 1A to 1F are schematic cross-sectional views showing the steps of the manufacturing process for a non-volatile memory according to one embodiment of the present invention.

Referring to FIG. 1A, a substrate 100 is provided. The substrate 100, for example, is a semiconductor substrate, a semiconductor compound substrate or a semiconductor-over-insulator (SOI) substrate. The semiconductor substrate, for example, is a Group IVA substrate, such as a silicon substrate or germanium substrate. The semiconductor compound substrate, for example, is a substrate formed of silicon carbide or silicide germanium, or gallium arsenide, for example. The substrate 100 includes a first region 102 and a second region 104. In the present embodiment, the first region 102, for example, is a memory cell region and the second region 104, for example, is a peripheral circuit region. This embodiment uses the manufacturing process for 2T-NOR-type memory as an example.

Referring to FIG. 1A, a tunnelling dielectric material layer 106 is formed on the substrate 100 in the first region 102 and the second region 104. The tunnelling dielectric material layer 106 may be composed of a single layer. The material of such single layer may be a low dielectric constant material or a high dielectric constant material. The low dielectric constant material having a dielectric constant lower than 4 may be, for example, silicon oxide or silicon oxynitride. The high dielectric constant material having a dielectric constant higher than 4 may be, for example, HfAlO, HfO$_2$, Al$_2$O$_3$, or Si$_3$N$_4$. The method of forming the tunnelling dielectric material layer 106 may be, for example, chemical vapor deposition, low pressure radical oxidation (LPRO), furnace oxidation or the like.

Next, referring to FIG. 1A, a floating gate material layer 110 is formed to cover the tunnelling dielectric material layer 106 in the first region 102 and the second region 104. The material of the floating gate material layer 110 may include polysilicon, doped polysilicon or other suitable materials, for example. Also shown in FIG. 1A, on the floating gate material layer 110 in the first region 102, an inter-gate dielectric material layer 112 and a first control gate material layer 114 are sequentially formed from bottom to top. The inter-gate dielectric material layer 112 may be formed of silicon oxide or of silicon oxide/silicon nitride/silicon oxide stacked materials, for example. The material of the first control gate material layer 114 may be, for example, doped polysilicon. An opening is included in the inter-gate dielectric material layer 112 and the first control gate material layer 114, to expose a portion of the floating gate material layer 110 in the first region 102.

Figure 1B:
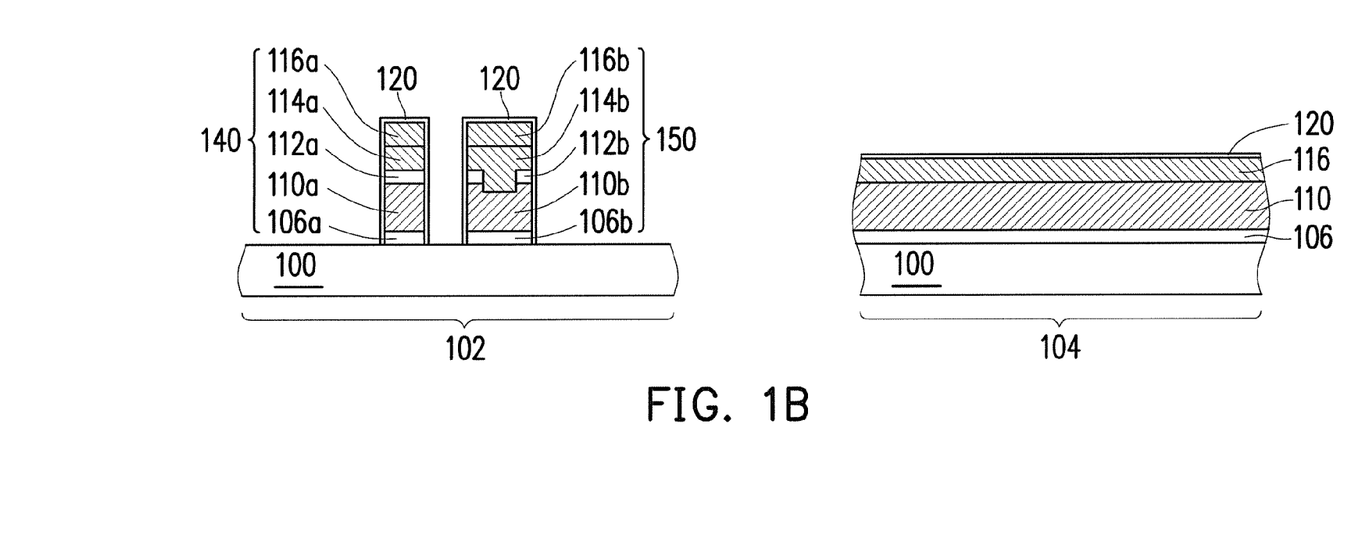

Referring to FIGS. 1A and 1B, a second control gate material layer 116 is formed in the second region 104 to cover the floating gate material layer 110 in the second region 104. In the first region 102, the second control gate material layer 116 (not shown) also covers the first control gate material layer 114 and fills up the opening 111. The material of the second control gate material layer 116 may be, for example, doped polysilicon. Subsequently, the second control gate material layer 116, the first control gate material layer 114, the inter-gate dielectric material layer 112, the floating gate material layer 110 and the tunnelling dielectric material layer 106 in the first region 102 are patterned to form a plurality of gate stack structures 140, 150. As shown in FIG. 1B, the gate stack structure 140 comprises, in sequence from bottom to top, the tunnelling dielectric layer 106a, the floating gate 110a, the inter-gate dielectric layer 112a, the first control gate 114a and the second control gate 116a, while the gate stack structure 150 comprises the tunnelling dielectric layer 106b, the floating gate 110b, the first control gate 114b and the second control gate 116b and the inter-gate dielectric layer 112b. Next, a first sidewall oxide layer 120 is formed to cover upper surfaces and sidewalls of the gate stack structures 140, 150 in the first region 102 and to cover the second control gate material layer 116 in the second region 104. The method for forming the first sidewall oxide layer 120 comprises an in-situ steam generation process or a furnace wet oxidation process. The first sidewall oxide layer 120 may be, for example, a silicon oxide layer. Generally, the temperature required for forming the first sidewall oxide layer 120 is higher, e.g., possibly up to 1000° C. for the in-situ steam generation process.

Figure 1C:
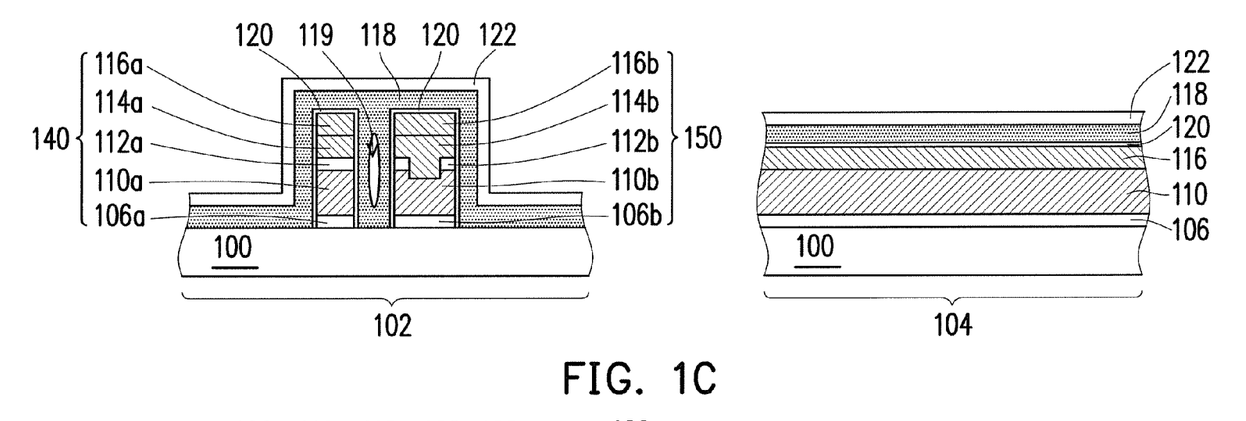

Referring to FIG. 1C, a first high-temperature deposition layer 118 is formed to cover the first sidewall oxide layer 120 in the first region 102 and the second region 104, and the first high-temperature deposition layer 118 between the gate stack structures 140, 150 having gaps 119. The material of the first high-temperature deposition layer 118 may be, for example, tetraethyl orthosilicate (TEOS). Subsequently, a protective layer 122 is further formed on the first high-temperature deposition layer 118. In the present invention, the protective layer 122 has a high etching selective ratio over the first high-temperature deposition layer 118. The preferred material for the protective layer 122 should be a material with an etching selective ratio of at least 30 with respect to silicon oxide, and is readily to be removed by wet etching. The protective layer 122 may be a single layer. The material for such single layer may be silicon nitride or polysilicon, for example. The protective layer 122 may be a two-layered structure comprising an inner layer and an outer layer, and the inner layer may be made of silicon nitride and the outer layer may be made of silicon oxynitride, for example. The method for forming the protective layer 122 may be, for example, chemical vapor deposition (CVD). The temperature required for forming the first high-temperature deposition layer 118 and the subsequent protective layer 122 ranges generally between 60~800° C.

Figure 1D:
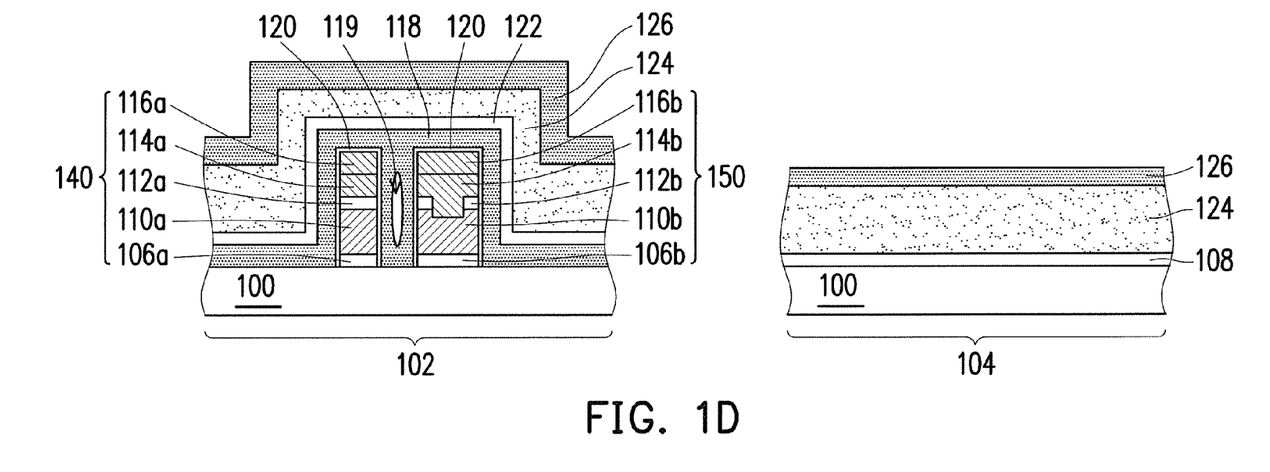

Referring to FIGS. 1C and 1D, after removing the protective layer 122, the first high-temperature deposition layer 118, the first sidewall oxide layer 120, the second control gate material layer 116 and the floating gate material layer 110 in the second region 104, an ion implantation process is then performed through the tunnelling dielectric material layer 106 to form the doped region in the second region 104. Next, as shown in FIG. 1D, the tunnelling dielectric material layer 106 is removed, and the gate oxide layer 108 is formed on the substrate 100 in the second region 104. The gate material layer 124 is formed to cover the gate oxide layer 108 in the second region 104 and cover the protective layer 122 in the first region 102. The material of the gate material layer 124 is, for example, doped polysilicon. Thereafter, a second high-temperature deposition layer 126 is deposited to cover the gate material layer 124 in the first region 102 and the second region 104. The material of the second material layer 126 may be, for example, tetraethyl orthosilicate.

Figure 1E:
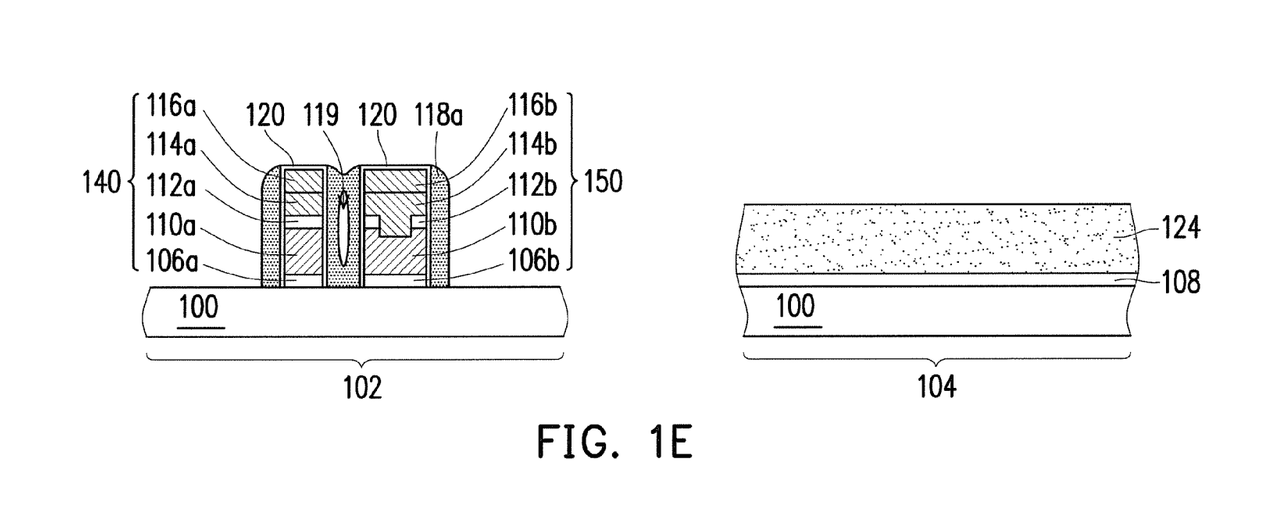

Referring to FIGS. 1D and 1E, after remove the second high-temperature deposition layer 126 and the gate material layer 124 in the first region 102, the protective layer 122 is then removed. Meanwhile, the second high-temperature deposition layer 126 in the second region 104 is not removed, so that at this time the second region 104 is protected by the second high-temperature deposition layer 126. By removing the protective layer 122 in the first region 102, the first high-temperature deposition layer 118 in the first region 102 is exposed. The method for removing the protective layer 122 may include a wet etching process. If the material of the protective layer 122 is silicon nitride, phosphoric acid may be used as an etchant for etching at 160° C., for example. If the material of the protective layer 122 is polysilicon, hot ammonium hydrogen peroxide mixture (APM) may be used as an etchant. Thereafter, as shown in FIG. 1E, anisotropic etching is performed to the first high-temperature deposition layer 118 in the first region 102 and the second high-temperature deposition layer 126 in the second region 104 to form first spacers 118a over the sidewalls of the gate stack structures 140 and 150 covered with the first sidewall layer 120, and a portion of the first sidewall oxide layer 120 on the upper surfaces of the gate stack structures 140 and 150 is exposed.

Figure 1F:
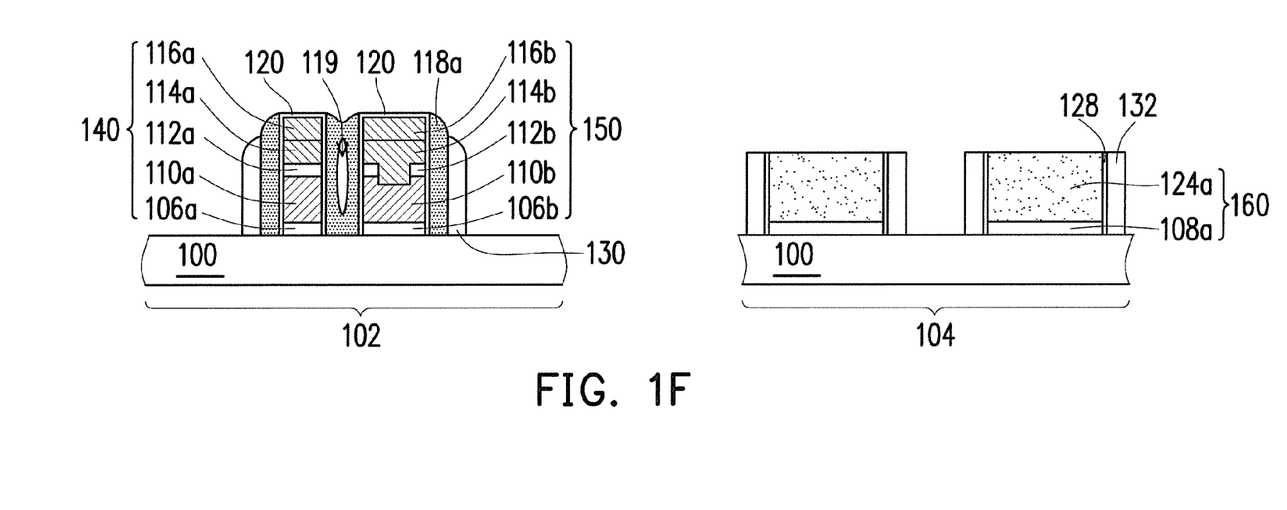

Referring to FIGS. 1E and 1F, the gate oxide layer 108 and the gate material layer 124 in the second region 104 are patterned to form a plurality of gate structures 160. As shown in FIG. 1F, each of the gate structures 160, from bottom to top in sequence, comprises a patterned gate oxide layer 108a and a gate 124a. Next, a second sidewall oxide layer 128 is formed covering the sidewalls of each gate structure 160 in the second region 104. The second sidewall oxide layer 128 is formed by rapid thermal oxidation, for example. The second sidewall oxide layer 128 may be, for example, a silicon oxide layer. The temperature required for forming the second sidewall oxide layer 128 may be around, for example, 800° C. Thereafter, second spacers 130 are formed at outer sides of the first spacers 118a in the first region 102, and a dielectric layer 132 is formed at the outer side of the second sidewall oxide layer 128 in the second region 104. In the present embodiment, the material of the second spacers 130 and the material of the dielectric layers 132 may be the same and be silicon nitride, for example. The method for forming the second spacers 130 and the dielectric layer 132 may be, for example, forming a dielectric material layer (not shown) by atomic layer deposition (ALD) to cover the first spacer 118a, the portion of the first sidewall oxide layer 120a located on the upper surfaces of the gate stack structures 140, 150, the second sidewall oxide layer 128 and the upper surfaces of the gate structures 160, and then anisotropic etching the dielectric material layer to form the second spacers 130 and the dielectric layer 132.

FIGS. 2A to 2F are schematic cross-sectional views showing the steps of the manufacturing process for a non-volatile memory according to another embodiment of the present invention. This embodiment uses the manufacturing process for 1T-NOR-type memory as an example.

Figure 2A:
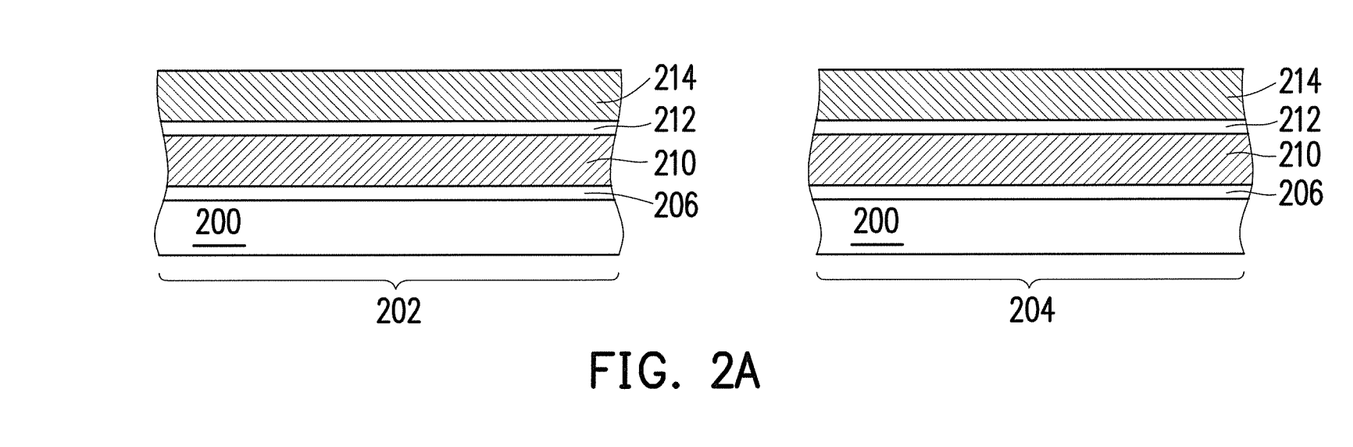
FIG. 2A to 2F are schematic cross-sectional views showing the steps of the manufacturing process for a non-volatile memory according to another embodiment of the present invention.

Referring to FIG. 2A, a substrate 200 is provided. The material of the substrate 200 is similar to the material of the substrate 100 in the above embodiment, and will not be repeated herein again. The substrate 200 includes a first region 202 and second region 204. In the present embodiment, the first region 202, for example, is a memory cell region and the second region 204, for example, is a peripheral circuit region. A tunnelling dielectric material layer 206, as shown in FIG. 2A, is formed on the substrate 200 in the first region 202 and the second region 204. The material and method for forming the tunnelling dielectric material layer 206 are similar to those of the tunnelling dielectric material layer 106 in the above embodiment, and will not be repeated herein again.

Next, referring to FIG. 2A, a floating gate material layer 210, an inter-gate dielectric material layer 212 and a control gate material layer 214 are sequentially formed, from bottom to top, to cover the tunnelling dielectric material layer 206 in the first region 202 and the second region 204. The material and the method for forming the floating gate material layer 210 and the inter-gate dielectric material layer 212 are similar to those of the floating gate material layer 110 and the inter-gate dielectric material layer 112 and will not be repeated herein again. The material of the control gate material layer 214 may be, for example, doped polysilicon.

Figure 2B:
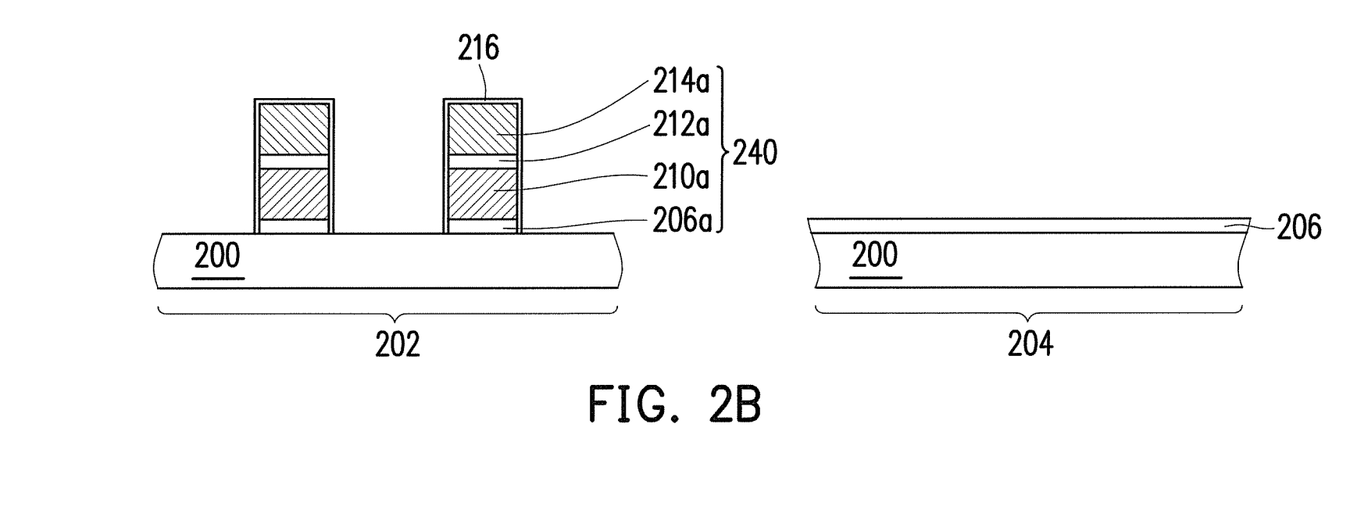

Referring to FIGS. 2A and 2B, patterning the control gate material layer 214, the inter-gate dielectric material layer 212, the floating gate material layer 210 and the tunnelling dielectric material layer 206 in the first region 202 to form a plurality of gate stack structures 240. As shown in FIG. 2B, the gate stack structure 240 comprises, in sequence from bottom to top, the tunnelling dielectric layer 206a, the floating gate 210a, the inter-gate dielectric layer 212a and the control gate 214a. At the same time, the control gate material layer 214, the inter-gate dielectric material layer 212 and the floating gate material layer 210 in the second region 204 are removed to expose the tunnelling dielectric material layer 206. Next, as shown in FIG. 2B, a first sidewall oxide layer 216 is formed to cover upper surfaces and sidewalls of the gate stack structures 240 in the first region 202. The method for forming the first sidewall oxide layer 216 comprises an in-situ steam generation process or a furnace wet oxidation process.

Figure 2C:
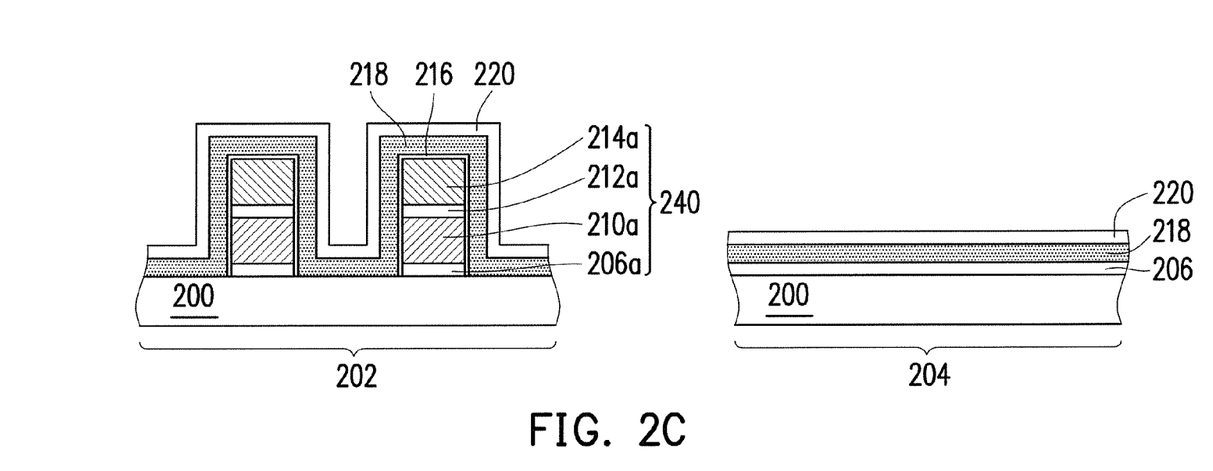

Referring to FIG. 2C, a first high-temperature deposition layer 218 is formed to cover the first sidewall oxide layer 216 in the first region 202 and the tunnelling dielectric material layer 206 in the second region 204. Subsequently, a protective layer 220 is further formed on the first high-temperature deposition layer 218. In the present invention, the protective layer 220 has a high etching selective ratio over the first high-temperature deposition layer 218, and is readily to be removed by wet etching. The materials and method for forming the first high-temperature deposition layer 218 and the protective layer 220 are similar to those of the first high-temperature deposition layer 118 and the protective layer 122, and will not be repeated herein.

Figure 2D:
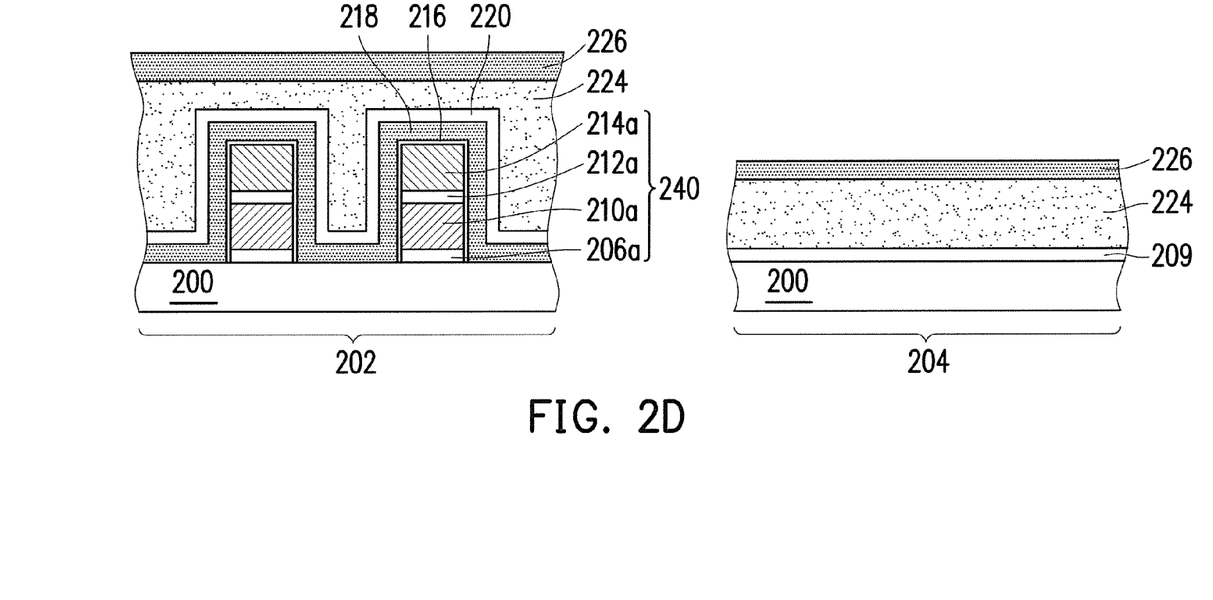

Referring to FIGS. 2C and 2D, after removing the protective layer 220 and the first high-temperature deposition layer 218 in the second region 204, an ion implantation process is performed to the tunnelling dielectric material layer 206 in the second region 204. Next, as shown in FIG. 2D, after the tunnelling dielectric material layer 206 is removed, the gate oxide layer 209 is formed on the substrate 200 in the second region 204. The gate material layer 224 is then formed to cover the gate oxide layer 209 in the second region 204 and cover the protective layer 220 in the first region 202. The material of the gate material layer 224 is, for example, doped polysilicon. Thereafter, a second high-temperature deposition layer 226 is deposited to cover the gate material layer 224 in the first region 202 and the second region 204. The material of the second material layer 226 may be, for example, tetraethyl orthosilicate.

Figure 2E:
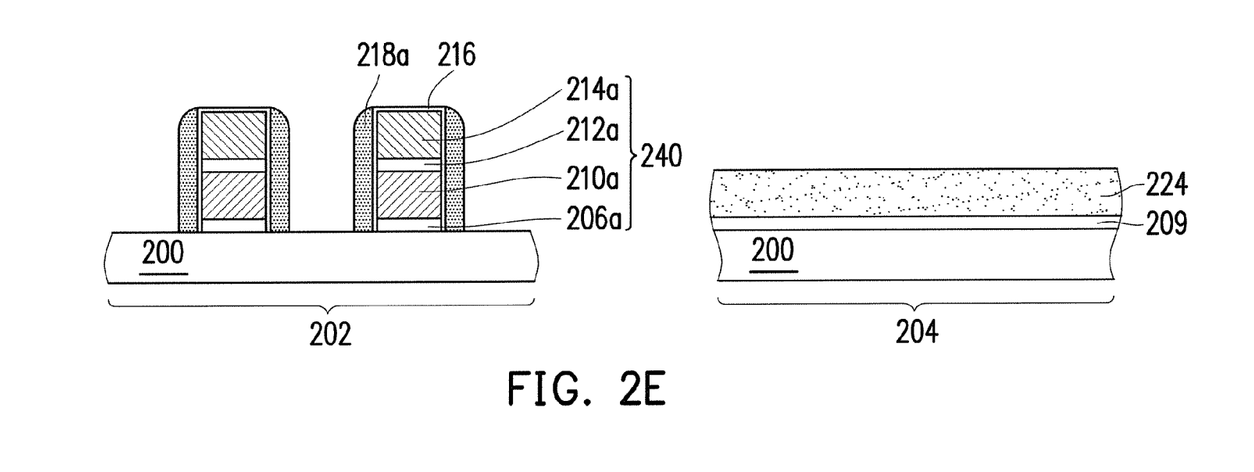

Referring to FIGS. 2D and 2E, after removing the second high-temperature deposition layer 226 and the gate material layer 224 in the first region 202, the protective layer 220 is then removed. Meanwhile, the second high-temperature deposition layer 226 in the second region 204 is not removed, so that at this time the second region 204 is protected by the second high-temperature deposition layer 226. By removing the protective layer 220 in the first region 202, the first high-temperature deposition layer 218 in the first region 202 is exposed. The method for removing the protective layer 220 is similar to the method for removing the protective layer 122 in the above embodiment. Thereafter, as shown in FIG. 2E, anisotropic etching is performed to the first high-temperature deposition layer 218 in the first region 202 and the second high-temperature deposition layer 226 in the second region 204 to form first spacers 218a over the sidewalls of the gate stack structures 240 covered with the first sidewall layer 216, and a portion of the first sidewall oxide layer 216 on the upper surfaces of the gate stack structures 240 is exposed.

Figure 2F:
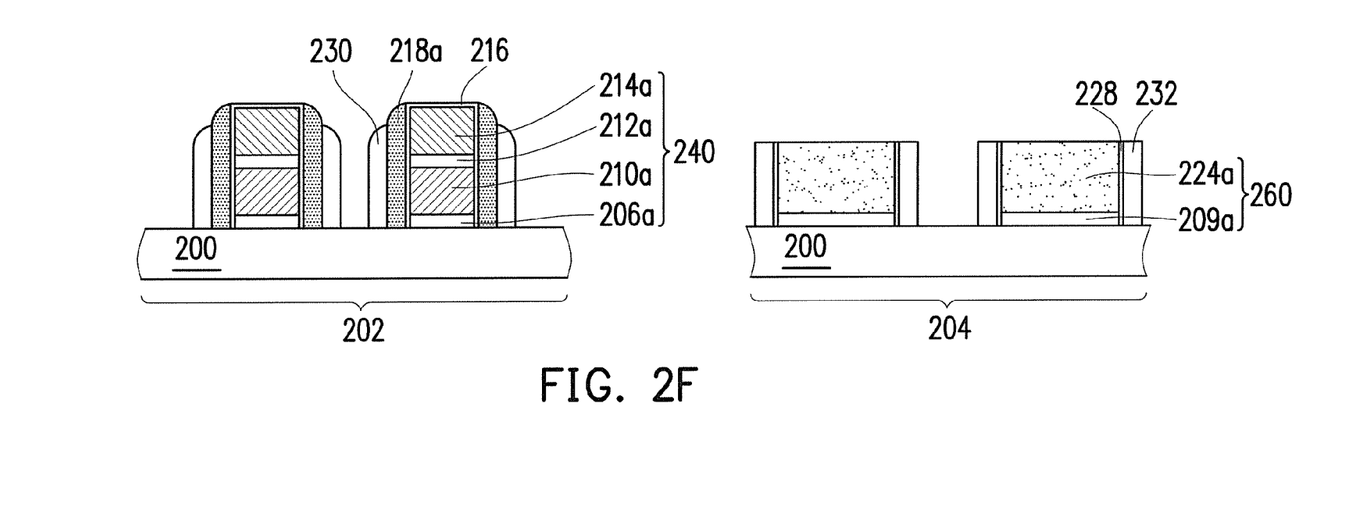

Referring to FIGS. 2E and 2F, the gate oxide layer 209 and the gate material layer 224 in the second region 204 are patterned to form a plurality of gate structures 260. As shown in FIG. 2F, each of the gate structures 260, from bottom to top in sequence, comprises a patterned gate oxide layer 209a and a gate 224a. Next, a second sidewall oxide layer 228 is formed covering the sidewalls of each gate structure 260 in the second region 204. The second sidewall oxide layer 228 is formed by rapid thermal oxidation, for example. The second sidewall oxide layer 228 may be, for example, a silicon oxide layer. Thereafter, second spacers 230 are formed at outer sides of the first spacers 218a in the first region 202, and a dielectric layer 232 is formed at the outer side of the second sidewall oxide layer 228 in the second region 204. In the present embodiment, the materials and methods for forming the second spacers 230 and the dielectric layers 232 are similar to those of the second spacers 130 and the dielectric layers 132 in the above embodiment and will not be repeated herein.

In summary, according to the embodiments of the present invention, the manufacturing method employs the higher temperature process to form the first sidewall oxide layer to cover the gate stack structure(s) in the memory cell region, and to form a protective layer on the first sidewall oxide layer in the memory cell region. Thereafter, the ion implantation process is performed in the peripheral circuit region, and the second sidewall oxide layer is formed to cover the gate structure(s) in the peripheral circuit region. For the manufacturing method of the non-volatile memory proposed in embodiments of the present invention, the temperature for forming the first sidewall oxide layer is higher than the temperature for forming the second sidewall oxide layer.

Because the higher temperature process is performed toward the memory cell region before the ion implantation process is performed toward the peripheral circuit region, it is possible to prevent implanted ions in the doped region from out-diffusing at high temperatures, which leads to the contour changes in the doped region. Therefore, the thermal shocks to the peripheral circuit region can be effectively avoided and the thermal budget can be lowered. As the thermal shocks to the peripheral circuit region is not concerned, a higher temperature process may be performed in the memory cell region to provide a sidewall oxide layer of good quality, which further enhances the performance of the memory cell. For the manufacturing method as described in the present invention, different processes can be carried out separately for different regions to form the sidewall oxide layer(s), and the process for forming the second sidewall oxide layer in the peripheral circuit region may be different from the process for forming the first sidewall oxide layer in the memory cell region. Hence, it is possible to employ different processes to form the oxide layers with different thickness and/or characteristics for various electrical needs or properties, so that the reliability of the memory cell is further enhanced. Further, since the first protective layer is formed on the first sidewall oxide layer in the memory cell region before performing the ion implantation process to the peripheral circuit region, damages due to ion implantation can be forestalled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a non-volatile memory, comprising:
    providing a substrate comprising a first region and a second region;
    performing a first patterning process to the first region to form a plurality of gate stack structures in the first region, and forming a first sidewall oxide layer to cover sidewalls and an upper surface of each of the plurality of gate stack structures after forming the plurality of gate stack structures;
    forming a first high-temperature deposition layer on the first sidewall oxide layer after the first sidewall oxide layer is formed;
    forming a protective layer on the first high-temperature deposition layer after the first high-temperature deposition layer is formed;
    performing an ion implantation process to the second region after forming the protective layer;
    forming a gate material layer in the second region after performing the ion implantation process to the second region;
    removing the protective layer in the first region to expose the underlying first high-temperature deposition layer after the gate material layer is formed in the second region;
    etching the first high-temperature deposition layer to form first spacers on the sidewalls of the plurality of gate stack structures covered with the first sidewall oxide layer and to expose a part of the first sidewall oxide layer on the upper surfaces of the plurality of gate stack structures;
    performing a second patterning process to the second region to form the plurality of gate structures in the second region after the first spacers are formed; and
    forming a second sidewall oxide layer to cover sidewalls of each of the plurality of gate structures.

2. The method of claim 1, wherein the first region is a memory cell region, and the second region is a peripheral circuit region.

3. The method of claim 1, wherein each of the plurality of gate stack structures includes a tunnel dielectric layer, a floating gate, an inter-gate dielectric layer and at least a control gate.

4. The method of claim 1, wherein each of the plurality of gate structures comprises a patterned gate oxide layer and a gate.

5. The method of claim 1, further comprising forming a second high-temperature deposition layer on the gate material layer after the gate material layer is formed in the second region.

6. The method of claim 5, further comprising removing the second high-temperature deposition layer, before removing the protective layer in the first region.

7. The method of claim 1, further comprising forming a second spacer outside of the first spacer and forming a dielectric layer outside of the second sidewall oxide layer after the second sidewall oxide layer is formed.

8. The method of claim 1, wherein a material of the protective layer is silicon nitride or polysilicon.

9. The method of claim 1, wherein the protective layer is a two-layered structure, and the two-layered structure comprises an inner layer and an outer layer.

10. The method of claim 9, wherein a material of the inner layer is silicon nitride, and a material of the outer layer is silicon oxynitride.

11. The method of claim 1, wherein the first sidewall oxide layer is formed at a temperature higher than a temperature at which the second sidewall oxide layer is formed.

12. The method of claim 11, wherein forming the first sidewall oxide layer comprises an in-situ steam generation process or a wet oxidation process.

13. The method of claim 11, wherein forming the second sidewall oxide layer comprises a rapid thermal oxidation process.

* * * * *